(12) United States Patent
Tihanyi

(10) Patent No.: US 7,423,325 B2
(45) Date of Patent: Sep. 9, 2008

(54) LATERAL FIELD-EFFECT-CONTROLLABLE SEMICONDUCTOR COMPONENT FOR RF APPLICATIONS

(75) Inventor: Jenoe Tihanyi, Kirchheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/806,958

(22) Filed: Mar. 23, 2004

(65) Prior Publication Data

US 2004/0245597 A1    Dec. 9, 2004

(30) Foreign Application Priority Data

Mar. 27, 2003    (DE) ................ 103 13 712

(51) Int. Cl.
*H01L 29/76* (2006.01)

(52) U.S. Cl. .................... 257/401; 257/368

(58) Field of Classification Search ........... 257/401, 257/368
See application file for complete search history.

(56) References Cited

U.S. PATENT DOCUMENTS

| 4,796,070 | A | 1/1989 | Black |
| 6,445,019 | B2 | 9/2002 | Van Dalen |
| 2003/0042556 | A1* | 3/2003 | Gajda et al. ............. 257/401 |

| 2003/0047792 | A1 | 3/2003 | Disney et al. |

FOREIGN PATENT DOCUMENTS

| EP | 1 073 123 | 1/2001 |
| EP | 1 168 455 | 1/2002 |
| EP | 1 291 907 | 3/2003 |

OTHER PUBLICATIONS

Baliga, B. Jayant, "Power Semiconductor Devices," Chapter 7: Power MOSFET, PWS Publishing Company, pp. 384-387 (1996).
Stengl, Jens Peer et al., "The Switching Response of Power MOSFETs," Pflaum Verlag, ISBN 3-7905-0619-2, pp. 73-79, (1992). (Translation Included, 8 pages).
German Office Action for German Application No. 103 13 712.2 mailed May 16, 2007 (5 pages).

* cited by examiner

*Primary Examiner*—Long Pham
(74) *Attorney, Agent, or Firm*—Dicke, Billig & Czaja, PLLC

(57) ABSTRACT

The present invention relates to a semiconductor component. The component includes a semiconductor body with a first semiconductor layer of a first conduction type and a second semiconductor layer of a second conduction type. The component includes, in the second semiconductor layer, a first terminal zone of the second conduction type, a drift zone of the second conduction type, a channel zone of the first conduction type, which is formed between the first terminal zone and the drift zone, and a second terminal zone of the second conduction type, which is arranged at a distance from the channel zone in the lateral direction of the semiconductor body. The component also includes a first drive electrode and at least one second drive electrode.

20 Claims, 3 Drawing Sheets

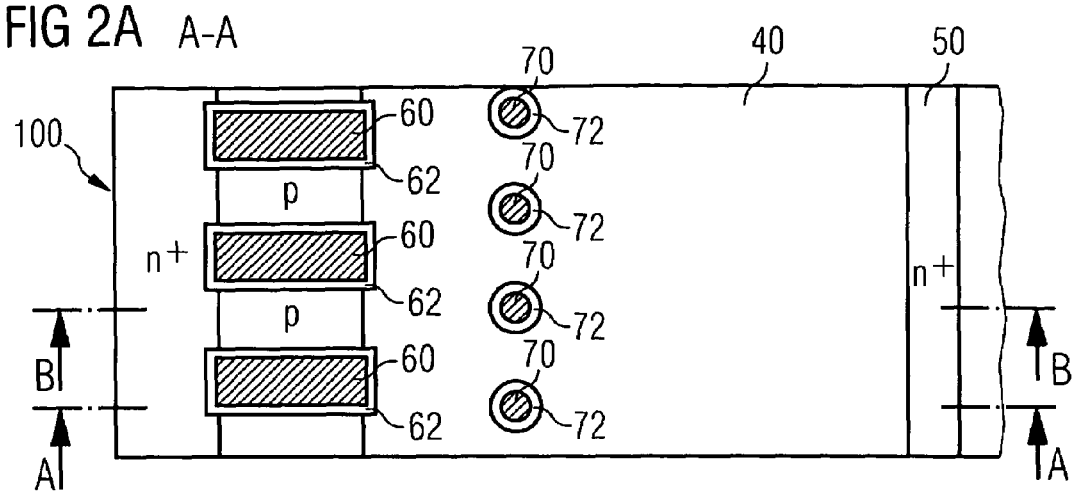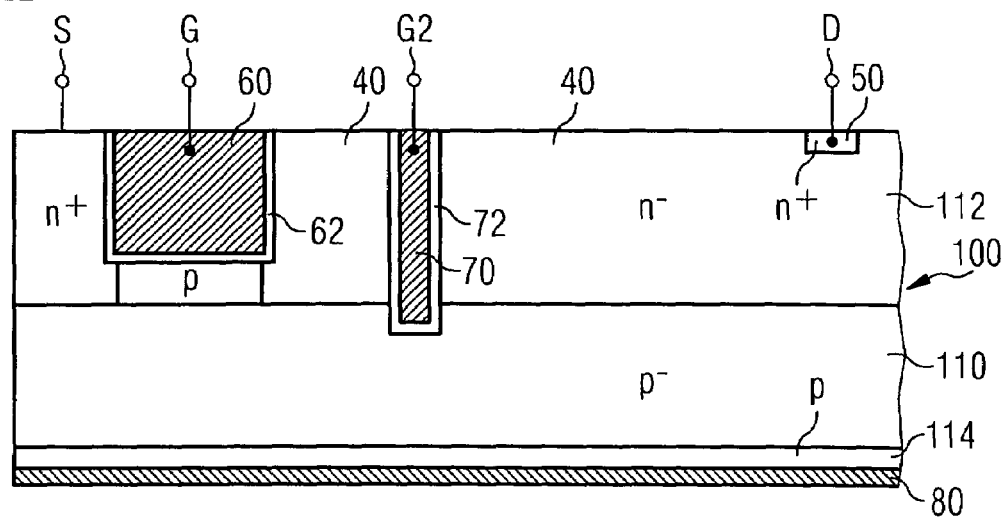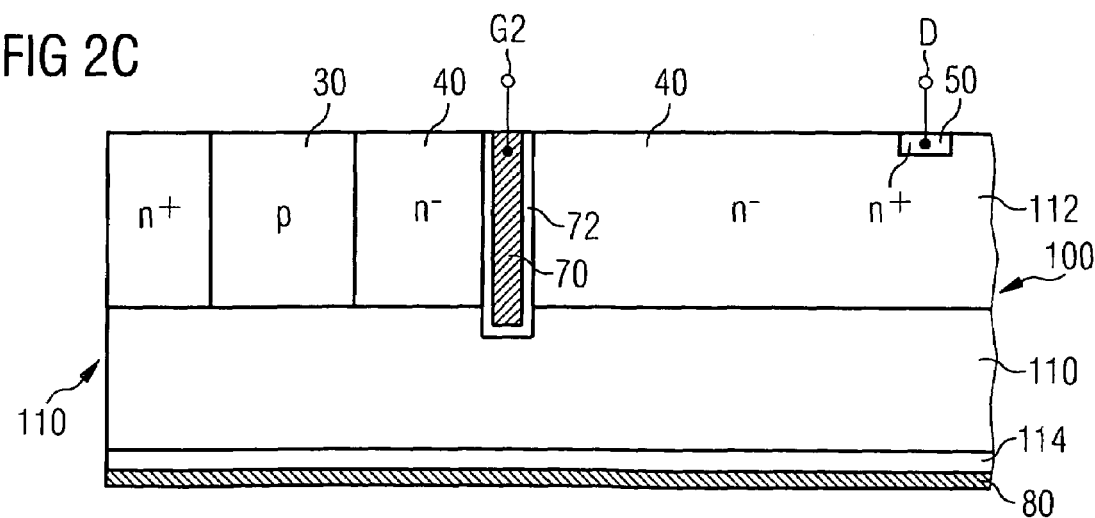

LATERAL FIELD-EFFECT-CONTROLLABLE SEMICONDUCTOR COMPONENT FOR RF APPLICATIONS

CROSS-REFERENCE TO RELATED APPLICATIONS

This Utility patent application claims priority to German Patent Application No. DE 103 13 712.2, filed on Mar. 27, 2003, which is incorporated herein by reference.

BACKGROUND

The present invention relates to a field-effect-controllable semiconductor component that is suitable for applications in radiofrequency circuits.

What acts in a restrictive manner for a use of MOS transistors for radiofrequency arrangements, in particular for the high-frequency switching of loads, is the parasitic gate-drain capacitance thereof, which is also referred to as the Miller capacitance or feedback capacitance. The effects and the properties of this feedback capacitance are described in detail in Stengl/Tihanyi: "Leistungs-MOS-FET-Praxis", ["Power MOS-FETs in practice"], Pflaum Verlag, Munich, 1992, pages 73-79, or in Baliga: "Power Semiconductor Devices", PWS Publishing, 1995, pages 384-387.

The mode of action of the feedback capacitance is explained briefly below with reference to FIG. 4. FIG. 4 illustrates a MOS transistor T with a gate terminal G, a source terminal S and a drain terminal D and a load connected in series with the drain-source path D-S thereof. The MOS transistor functions as a low-side switch connected between the load and the negative supply potential, or reference-ground potential. The load terminal remote from the MOS transistor is connected to the positive supply potential V+. FIG. 4 furthermore illustrates the parasitic gate-drain capacitance Cgd of the MOS transistor, which lies between the drain terminal D thereof and the gate terminal thereof and whose capacitance value increases in the on state in comparison with the off state. If the normally off MOS transistor illustrated is turned on by application of a suitable positive drive potential, then the potential at the drain terminal of the MOS transistor decreases from a value—which corresponds to the value of the supply potential V+ in the off state—approximately to reference-ground potential in the case of the transistor being fully turned on. This decrease in the voltage at the drain terminal D counteracts the drive potential at the gate terminal by way of the feedback capacitance, this feedback effect being greater, the larger the capacitance Cgd and the higher the switching frequency.

Power MOS transistors require cooling in order to prevent damage due to the heat loss that occurs during switching operations. The requirements made of this cooling increase as the switching frequency increases, owing to the heat loss that increases as the switching frequency increases. Optimum cooling conditions can be achieved if the semiconductor body with the transistor is applied directly to a heat sink.

Customary power transistors are formed as vertical components whose terminals for the gate and source terminals are situated at the front side of the semiconductor body and whose drain terminal is formed by the rear side of the semiconductor body. In the case of power transistors which serve as low-side switches and in which the drain potential changes depending on the switching state of the power transistor, direct application of the rear side of the semiconductor body to the heat sink is unsuccessful due to the fact that customary heat sinks are made of metal and, in particular in the case of high-frequency potential changes, act like an antenna and thus cause EMC interference. This is remedied by electrically insulating layers between the semiconductor body and the heat sink, which, however, increase the thermal resistance between semiconductor body and heat sink.

SUMMARY

One embodiment of the present invention provides a field-effect-controllable semiconductor component that is suitable for high-frequency circuit arrangements and that can be cooled in a simple manner, in particular by direct fixing on a heat sink.

The semiconductor component according to one embodiment of the invention comprises a semiconductor body with a first semiconductor layer of a first conduction type and a second semiconductor layer, which is applied on the first semiconductor layer and forms a front side of the semiconductor body. In the second semiconductor layer, there are formed a first terminal zone of a first conduction type, a drift zone of the first conduction type, a channel zone of the first conduction type, which is formed between the first terminal zone and the drift zone, and a second terminal zone of the second conduction type, which is arranged at a distance from the channel zone in the lateral direction of the semiconductor body. A first drive electrode is arranged in a manner insulated from the semiconductor body and adjacent to the channel zone. In addition, at least one second drive electrode is present, which, proceeding from the front side, extends through the second semiconductor layer right into the first semiconductor layer and that is insulated from the semiconductor body.

This semiconductor component realizes a lateral MOS transistor, the at least one second drive electrode being formed in the drift zone thereof. The first terminal zone forms the source zone, which is isolated from the drift zone by the channel zone or body zone, and the second terminal zone forms the drain zone. The source zone, the drain zone and the drift zone are n-doped in the case of an n-conducting MOSFET, while the channel zone is p-doped. In the case of a p-conducting MOSFET, the aforementioned semiconductor zones are correspondingly doped complementarily. The semiconductor component may also be formed as an IGBT, the second terminal zone or drain zone then being doped complementarily to the drift zone.

In the semiconductor component according to one embodiment of the invention, the second control electrode, which is at a fixed potential serves, in the off-state case, that is, when a high potential is present at the second terminal zone and the component is not driven in the on state, so that the pn junction between the channel zone and the drift zone effects blocking, to shield the channel zone and thus the semiconductor region adjacent to the first control electrode, which forms the gate electrode of the MOS transistor, from high potentials. This results in a reduction of the feedback capacitance or Miller capacitance, as a result of which the component is particularly suitable as a switch for the high-frequency switching of a load.

In one embodiment, a plurality of second control electrodes arranged at a distance from one another are present, between which channels of the drift zone extend. With the component in the off state, said channels are pinched off as the reverse voltage increases, in order thereby to shield the semiconductor region adjacent to the gate electrode from the high potentials present at the second terminal zone.

In one embodiment, the individual second control electrodes are preferably formed in pillar-type fashion with a circular, rectangular or other polygonal cross section. The control electrodes extending through the first semiconductor layer right into the second semiconductor layer may also be formed in plate-type fashion, the plates extending in the lateral direction of the semiconductor body in a direction which leads from the first to the second terminal zone, or vice versa.

The second control electrodes, which in one embodiment are connected to a defined potential, are completely surrounded by an insulation layer in the semiconductor body. The defined potential to which the at least one second control electrode is connected is in one embodiment identical to the potential to which the first terminal zone/source zone of the component is connected. In the case of an n-conducting MOS transistor used as a low-side switch, this potential usually corresponds to reference-ground potential, or ground.

The first drive electrode, which represents the gate electrode of the MOS transistor, is for example arranged above the front side of the semiconductor body adjacent to the channel zone and insulated from the semiconductor body by means of an insulation layer applied on the front side.

Furthermore, it is possible to arrange the gate electrode in a trench in the semiconductor body in order thus to obtain a sidewall transistor, the basic structure of which is disclosed in DE 198 40 032 C2.

In the MOS transistor according to one embodiment of the invention, the source, gate and drain terminals are situated at the front side of the semiconductor body. In addition, the rear side of the semiconductor body is insulated from the source, drain and body zones arranged in the region of the front side by the pn junction between the first semiconductor layer 110 and the second semiconductor layer 112, so that the rear side can be applied directly to a heat sink. In the case of an n-conducting MOS transistor in which the second semiconductor layer is n-doped and the first semiconductor layer is p-doped, said heat sink is connected to the lowest potential that occurs in the circuit in which the MOS transistor is used. This ensures that the pn junction between the first and second semiconductor layers 110, 112 always effects blocking.

In the case where the semiconductor component is driven in the on state, there are generated in the drift zone in addition to the majority charge carriers, that is, electrons in the case of an n-conducting component and holes in the case of a p-conducting component, also minority charge carriers, that is, holes or electrons, respectively. Said minority charge carriers are "trapped" by the semiconductor layer, which is doped complementarily to the drift zone and lies underneath, and are thereby prevented from propagating. In order to amplify this effect, there are present in the drift zone, in one embodiment, semiconductor zones of the first conduction type, which are thus doped complementarily to the drift zone. These semiconductor zones that are doped complementarily to the drift zone preferably lie adjacent to the second control electrode. In addition, said semiconductor zones which are doped complementarily to the drift zone are preferably connected to the same potential as the first semiconductor layer 110 on the rear side.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 2A illustrates a further exemplary embodiment of a semiconductor component according to an embodiment of the invention in plan view in cross section.

FIG. 2B illustrates a further exemplary embodiment of a semiconductor component according to an embodiment of the invention in side view in cross section.

FIG. 2C illustrates a further exemplary embodiment of a semiconductor component according to an embodiment of the invention in side view in cross section.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
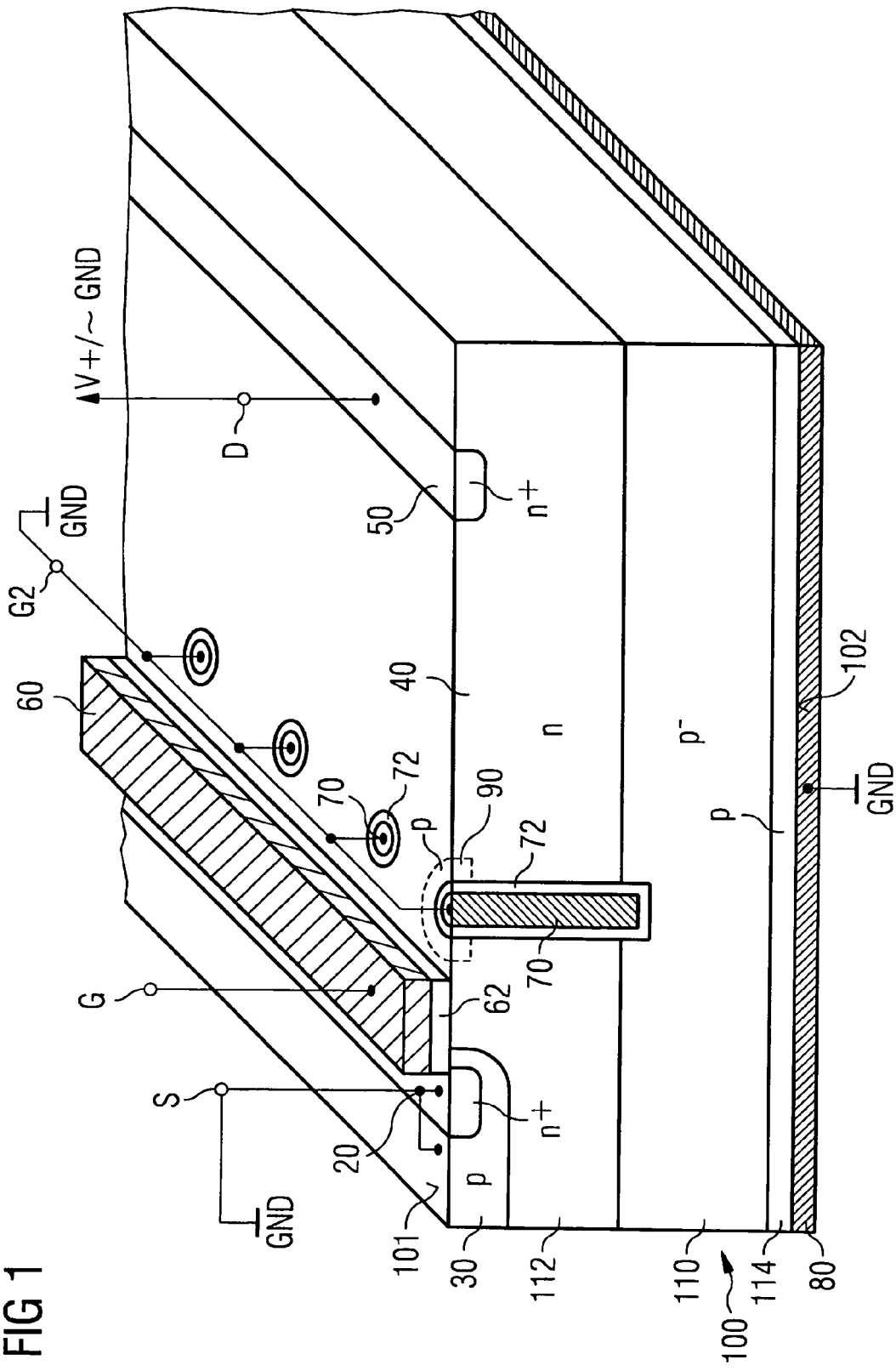
FIG. 1 illustrates a first exemplary embodiment of a semiconductor component according to an embodiment of the invention in a perspective illustration in cross section.

FIG. 1 illustrates a perspective view in cross section of a first exemplary embodiment of a semiconductor component according to the invention, which is formed as an n-conducting MOS transistor. It should be pointed out that the invention is not restricted to n-conducting components, but rather can also be applied to p-conducting components, in which case the n-doped semiconductor zones hereafter are to be correspondingly replaced by p-doped semiconductor zones and the p-doped semiconductor zones hereafter are to be correspondingly replaced by n-doped semiconductor zones.

The MOS transistor illustrated comprises a semiconductor body 100 with a first semiconductor layer 110, which is weakly p-doped, and a second semiconductor layer 112, which is applied on the first semiconductor layer 110, is n-doped and, in the exemplary embodiment, forms the front side 101 of the semiconductor body 100.

The first semiconductor layer 110 is for example a semiconductor substrate to which the second semiconductor layer 112 is applied by means of epitaxy.

In the second semiconductor layer 112, a p-doped channel zone/body zone is present in the region of the front side 101, a heavily n-doped first terminal zone 20, which forms the source zone, being arranged in said channel zone/body zone. At a distance from the channel zone 30 and the source zone 20 in the lateral direction of the semiconductor body 100, a heavily n-doped second terminal zone 50 is arranged in the region of the front side 101 in the second semiconductor layer 112, said second terminal zone 50 forming the drain zone of the MOS transistor. A section 40 of the second semiconductor layer 112 between the channel zone 30 and the drain zone 50 forms the drift zone of the MOS transistor, the source zone 20 being isolated from the drift zone 40 by the channel zone 30. In order to form a conductive channel in the channel zone between the source drain 20 and the drift zone 40, a first control electrode 60 is present, which, in the exemplary embodiment, is arranged above the front side 101 and is insulated from the semiconductor body 100 by means of an insulation layer 62.

In addition to the first control electrode 60 serving as gate electrode G of the MOS transistor, a plurality of second control electrodes 70 are present, which are arranged at a distance from one another and, proceeding from the front side 101, extend in the drift zone 40 through the second semiconductor layer 112 right into the first semiconductor layer 110, said second control electrodes or auxiliary electrodes 70 being insulated from the semiconductor body 100 by means of insulation layers 72. Said second control electrodes are in each case arranged, in the lateral direction of the semiconductor body 100, at a distance from the channel zone 30 and in addition at a distance from the gate electrode 60, the second control electrodes 70, in the manner illustrated, lying nearer to the channel zone 30 than to the drain zone 50.

The first semiconductor layer 110 has a semiconductor layer 114 in the region of the rear side 102 of the semiconductor body 100 opposite to the front side 101, said semiconductor layer 114 being doped somewhat more heavily than the remaining regions of the first semiconductor layer 110. Said semiconductor layer 114 is preferably a weakly recrystallized p-doped semiconductor layer. A metal layer is preferably applied to the rear side 102, which metal layer produces a readily thermally conductive connection to the semiconductor body 100 in order, when the arrangement is applied to a heat sink (not illustrated), to enable a good thermally conductive connection between the semiconductor body 100 and the heat sink.

One method of operation of the component illustrated is explained below for the application already explained above, in which the MOS transistor serves as a low-side switch for switching a load. The source zone 20 is then connected to reference-ground potential GND, a terminal electrode S of said source zone 20 only being illustrated diagrammatically in FIG. 1. As is likewise illustrated diagrammatically, the source zone 20 is preferably short-circuited with the body zone 30, which is usually effected via the source terminal electrode in order thereby to reduce, in a sufficiently known manner, the current gain of the parasitic bipolar transistor formed by the drift zone 40, the body zone 30 and the source zone 20. The potential at the drain terminal of the MOS transistor varies between supply potential V+ with the transistor in the off state and approximately reference-ground potential GND with the transistor in the on state.

The second control electrodes 70 and the rear side 102 of the semiconductor body, or the p-doped first semiconductor layer 110, are connected to source potential and thus, in the example illustrated, to reference-ground potential GND.

When the gate electrode 60 is driven in the on state, the auxiliary electrodes 70 have virtually no influence on the electrical properties of the MOS transistor. In this case, a conductive channel forms below the front side 101 in the channel zone between the source zone 20 and the drift zone 40, as a result of which, when a voltage is present between the drain terminal D and the source terminal S, essentially majority charge carriers, namely electrons, flow between the source zone 20 and the drain zone 50. If the transistor is turned off, that is, the drive potential of the gate electrode 60 is reduced to an extent such that the conductive channel is interrupted, then a space charge zone propagates in the drift zone 40 proceeding from the channel zone 30, said space charge zone advancing in the direction of the drain zone 50 as the reverse voltage increases. If said space charge zone approaches the auxiliary electrodes 70, that is to say the potential rises in the drift zone 40 proceeding from the channel zone 30, then the auxiliary electrodes 70 connected to reference-ground potential ensure that the channels of the drift zone 40 which are present between them are pinched off. The auxiliary electrodes 70 thus shield that semiconductor region of the drift zone 40 which lies between the channel zone 30 and the auxiliary electrodes from high potentials present on the drain side. This shielding effect brings about a reduction of the reactive effect of the potentials present at the drain terminal D on the gate electrode, which corresponds to a reduction of the gate-drain capacitance or reverse transfer capacitance or Miller capacitance of the MOS transistor.

The pn junction between the first semiconductor layer 110 and the second semiconductor layer 112 has the effect that even when a positive supply potential is present at the drain terminal D, no current can flow to the rear side of the semiconductor body 100 connected to the reference-ground potential GND. The semiconductor body can thus be cooled by means of a heat sink connected to reference-ground potential, without restricting the method of operation of the component or bringing about an EMC interference emission.

With the component in the on state, in addition to the majority charge carriers, which are electrons in the case of the component illustrated, majority charge carriers, that is, holes, are also generated. Said holes are prevented from propagating in the drift zone, and in particular from penetrating into the channel zone 30, in particular by the p-doped first semiconductor layer 110 connected to reference-ground potential. Further p-doped semiconductor zones are present in the drift zone 40, in particular below the front side 101 and adjacent to the auxiliary electrodes 70, and are likewise at the same potential as the rear side of the semiconductor body 100 and prevent minority charge carriers from propagating in the drift zone.

The component is constructed in such a way that the channel length, that is to say the distance between the source zone 20 and the drift zone 40, is very small in comparison with the rest of the dimensions. The same applies correspondingly to the dimensions of the gate electrodes 60 along the channel between the source zone 20 and the drift zone 40. The channel length, and correspondingly the length of the gate electrode, are in the submicron range.

The component is fabricated by firstly fabricating a p-doped semiconductor substrate, which forms the later first semiconductor layer 110, an n-doped semiconductor layer, which forms the later second semiconductor layer 112, being applied to said substrate by means of an epitaxy method, the source, channel and drain zones and also the gate electrode being fabricated by means of sufficiently known methods. Before the metal layer 80 is applied to the rear side, the substrate is ground thin in order to achieve a total slice thickness of less than 50 μm, the thickness of the epitaxy layer in this case being between 5 and 10 μm. The distance between the gate electrode 60 and the drain zone 50 is less than 10 μm.

Figure 3:
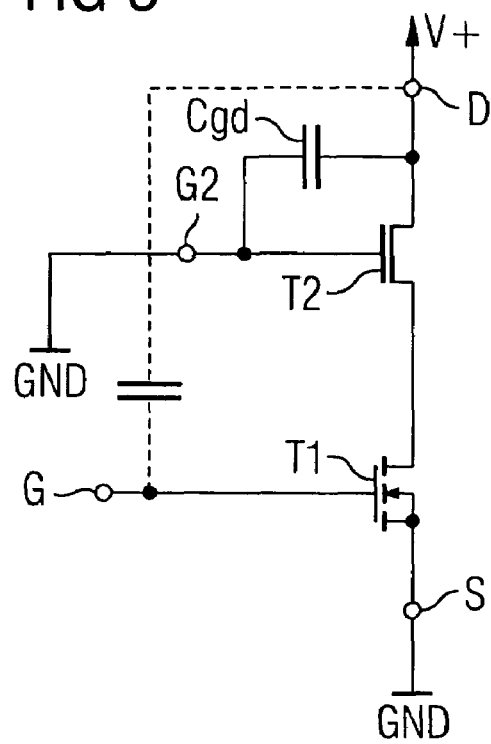
FIG. 3 illustrates the electrical equivalent circuit diagram of the semiconductor component according to an embodiment of the invention.
Figure 4:
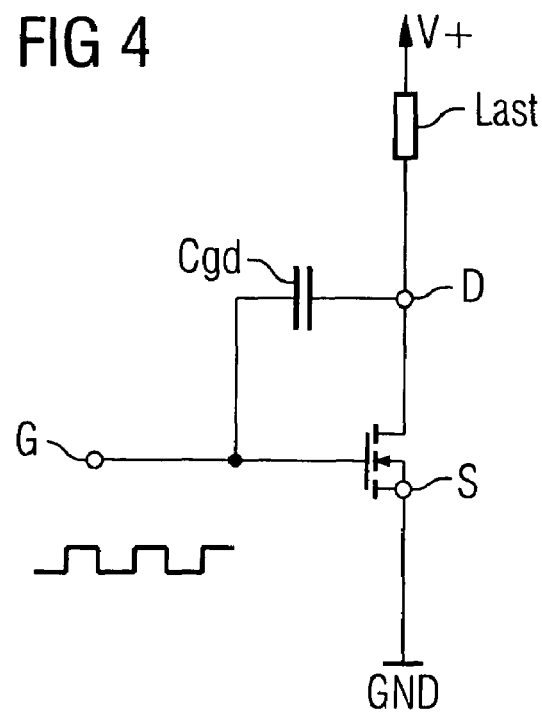
FIG. 4 illustrates an application example according to the prior art for a MOS transistor as a low-side switch for driving a load.

The electrical equivalent circuit diagram of the semiconductor component illustrated in FIG. 1 is illustrated in FIG. 3. As shown by the equivalent circuit diagram, a normally on MOS transistor is formed by the auxiliary electrode 70 in the drift zone 40, the reverse transfer capacitance of the component critically being present between the drain terminal and the control terminal G2—connected to reference-ground potential GND—of this depletion-mode transistor, as a result of which the reverse transfer capacitance Cgd does not influence the switching state of the component produced by means of the drive potential at the gate terminal G. A capacitance formed between the drain terminal D and said gate terminal G, which capacitance is depicted by broken lines in the equivalent circuit diagram, is significantly less than the reverse transfer capacitance between the drain terminal D and the auxiliary electrodes 70.

FIGS. 2A-C illustrate a further exemplary embodiment of a semiconductor component according to the invention. FIG. 2A illustrates the component in plan view in cross section and FIGS. 2B and 2C illustrate it in side view in cross section along the sectional planes A-A and B-B depicted in FIG. 2A.

The component in accordance with FIGS. 2A-C is formed as a sidewall transistor and differs from the component illustrated in FIG. 1 essentially by the arrangement of the gate electrode 60. In the case of the component in accordance with FIG. 2, a plurality of gate electrodes are arranged in the semiconductor body 100 and extend, proceeding from the front side 101, in the vertical direction into the semiconductor body and are insulated from the semiconductor body by means of a gate insulation layer 61. In the exemplary embodiment in accordance with FIG. 2, the p-doped channel zone reaches from the front side 101 as far as the first semiconductor layer 10, the gate electrodes 60 ending above the first semiconductor layer 110, as is illustrated in FIG. 2. Like the channel zone 30, the source zone 20 likewise reaches from the front side 101 as far as the first semiconductor layer 110. The gate electrode 60 has a plurality of sections which are arranged at a distance from one another and are formed essentially in plate-type fashion and extend in the lateral direction of the semiconductor body from the drift zone 40 through the channel zone 30 right into the source zone 20.

As in the case of the component in accordance with FIG. 1, the component in accordance with FIG. 2 comprises auxiliary electrodes 70 which reach from the front side 101 right into the first semiconductor layer and are insulated from the semiconductor body 100 by insulation layers 72.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component comprising:
a semiconductor body with a first semiconductor layer of a first conduction type and a second semiconductor layer of a second conduction type, which is applied on the first semiconductor layer and forms a front side of the semiconductor body;
in the second semiconductor layer, a first terminal zone of the second conduction type, a drift zone of the second conduction type, a channel zone of the first conduction type, which is formed between the first terminal zone and the drift zone, and a second terminal zone of the second conduction type, which is arranged at a distance from the channel zone in a lateral direction of the semiconductor body;
a gate electrode arranged in a manner insulated from the semiconductor body and adjacent to the channel zone; and
a plurality of auxiliary electrodes arranged at a distance from one another, and each formed in pillar-type fashion such that each auxiliary electrode has a length and has a cross-section, wherein the dimensions of the auxiliary electrode in the cross section extend in a lateral plane that is perpendicular to the length;
wherein at least one of the plurality of auxiliary electrodes, which, proceeding from the front side, extends through the second semiconductor layer right into the first semiconductor layer and which is insulated from the semiconductor body; and
wherein at least one of the plurality of auxiliary electrodes has no dimension in the lateral plane that extends substantially beyond any other dimension in the lateral plane.

2. The semiconductor component of claim 1, wherein the plurality of auxiliary electrodes are completely surrounded by an insulation layer in the semiconductor body.

3. The semiconductor component of claim 2, wherein the plurality of auxiliary electrodes are connected to a defined potential.

4. The semiconductor component of claim 3, wherein the plurality of auxiliary electrodes and the first terminal zone are connected to the same potential.

5. The semiconductor component of claim 1, wherein the gate electrode is arranged above the front side of the semiconductor body.

6. The semiconductor component of claim 1, wherein the gate electrode is arranged in the semiconductor body.

7. The semiconductor component of claim 1, wherein the first semiconductor layer has a more heavily doped semiconductor layer of the first conduction type at a side remote from the second semiconductor layer.

8. The semiconductor component of claim 1, wherein at least one semiconductor zone of the first conduction type is arranged in the drift zone adjacent to the at least one auxiliary electrode.

9. The semiconductor component of claim 8, wherein the at least one semiconductor zone is arranged in the region of the front side of the semiconductor body.

10. The semiconductor component of claim 1, wherein the at least one auxiliary electrode is arranged nearer to the channel zone than to the second terminal zone.

11. A semiconductor component comprising:
a semiconductor body having a first layer of a first conduction type and a second layer of a second conduction type, the second layer applied onto the first layer thereby forming a front side of the semiconductor body;
a first terminal zone of the second conduction type in the second layer;
a drift zone of the second conduction type in the second layer;
a channel zone of the first conduction type formed between the first terminal zone and the drift zone;
a second terminal zone of the second conduction type, wherein the second terminal zone and the channel zone are separated by a distance in a lateral direction on the front side of the semiconductor body;
a gate electrode insulated from the semiconductor body and adjacent the channel zone; and
a plurality of auxiliary electrodes arranged at a distance from one another and each auxiliary electrode formed in pillar-type fashion such that each have a length and each have dimensions in the lateral directions, wherein all of the dimensions in the lateral directions are substantially smaller than the length;

wherein at least one auxiliary electrode extends along its length from the front side through the second layer into the first layer and insulated from the semiconductor body.

12. The semiconductor component of claim 11, wherein the plurality of auxiliary electrodes are completely surrounded by an insulation layer in the semiconductor body.

13. The semiconductor component of claim 11, wherein the plurality of auxiliary electrodes are connected to a defined potential.

14. The semiconductor component of claim 13, wherein the plurality of auxiliary electrodes and the first terminal zone are connected to the same potential.

15. The semiconductor component of claim 11, wherein the gate electrode is arranged in the semiconductor body.

16. The semiconductor component of claim 11, wherein the first semiconductor layer has a more heavily doped semiconductor layer of the first conduction type at a side remote from the second semiconductor layer.

17. A semiconductor component comprising:
a semiconductor body having a first layer of a first conduction type and a second layer of a second conduction type, the second layer applied onto the first layer thereby forming a front side of the semiconductor body;
a first terminal zone of the second conduction type in the second layer;
a drift zone of the second conduction type in the second layer;
a channel zone of the first conduction type formed between the first terminal zone and the drift zone;
a second terminal zone of the second conduction type, wherein the second terminal zone and the channel zone are separated by a distance in a lateral direction on the front side of the semiconductor body;
a gate electrode insulated from the semiconductor body and adjacent the channel zone; and
a plurality of auxiliary electrodes arranged at a distance from one another and each configured in a substantially cylindrical shape;
wherein at least one auxiliary electrode extends from the front side through the second layer into the first layer and insulated from the semiconductor body.

18. The semiconductor component of claim 17, wherein each of the plurality of auxiliary electrodes have a substantially circular cross-section.

19. The semiconductor component of claim 1, wherein each of the plurality of auxiliary electrodes are configured in a cylindrical shape.

20. The semiconductor component of claim 11, wherein each of the plurality of auxiliary electrodes are configured in a cylindrical shape.

* * * * *